(12) United States Patent
Schapendonk et al.

(10) Patent No.: US 11,545,967 B1
(45) Date of Patent: Jan. 3, 2023

(54) POWER SUPPLY WITH STARTUP CIRCUIT FOR LOW POWER DEVICES

(71) Applicant: NXP B.V., Eindhoven (NL)

(72) Inventors: Edwin Schapendonk, Oss (NL); Wouter van der Heijden, Nijmegen (NL); Oswald Moonen, Eindhoven (NL); Henri Verhoeven, Someren (NL); Ton van Deursen, Best (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/446,264

(22) Filed: Aug. 27, 2021

(51) Int. Cl.
 *H03K 5/02* (2006.01)
 *H02M 3/07* (2006.01)

(52) U.S. Cl.
 CPC ............... *H03K 5/02* (2013.01); *H02M 3/07* (2013.01)

(58) Field of Classification Search
 CPC .................................. H03K 5/02; H02M 3/07
 See application file for complete search history.

(56) References Cited

U.S. PATENT DOCUMENTS

| | | | | |
|---|---|---|---|---|
| 6,229,385 B1 * | 5/2001 | Bell | ................ | G01R 31/31701 327/536 |
| 10,686,377 B1 * | 6/2020 | Lu | ........................ | H02M 3/158 |
| 2008/0246409 A1 * | 10/2008 | Yu | ........................ | H05B 39/041 315/219 |
| 2017/0332448 A1 * | 11/2017 | Lookman | ............... | H05B 45/48 |

OTHER PUBLICATIONS

Tran-Dinh et al., "Power Management IC With a Three-Phase Cold Self-Start For Thermoelectric Generators," IEEE Transactions On Circuits and Systems—1: Regular Papers, vol. 68, No. 1, Jan. 2021, 11 pages.
Luo et al., "A Sub-10 mV Power Converter With Fully Integrated Self-Start, MPPT, and ZCS Control for Thermoelectric Energy Harvesting," IEEE Transactions On Circuits and Systems—I: Regular Papers, vol. 65, No. 5, May 2018, 14 pages.
Li et al., "Integrated Switched-Capacitor-Based Cold-Start Circuit for DC-DC Energy Harvesters with Wide Input/Output Voltage Range and Low Inductance in 40-nm CMOS," 2018 IEEE Applied Power Electronics Conference and Exposition (APEC), 6 pages.

* cited by examiner

*Primary Examiner* — Sibin Chen

(57) ABSTRACT

An integrated circuit (IC) includes an input/output (I/O) circuitry with a first circuitry section including I/O pins and a second circuitry section including I/O pins. The first and second circuitry sections are mutually exclusive sections of the I/O ring. The first circuitry section includes a first I/O pin configured to receive an input voltage from a first energy source and a second I/O pin connectable to an external startup capacitor. A startup circuit is coupled to the first I/O pin and the second I/O pin. Upon receiving the input voltage from the first energy source, the startup circuit enters a during the startup phase and isolates the first circuitry section from the second circuitry section, and provides charge to the external startup capacitor. In response to achieving a predetermined minimum charge on the external startup capacitor, the first circuitry section is connected to the second circuitry section, and the startup phase ends and the IC transitions to a functional mode of operation.

19 Claims, 5 Drawing Sheets

POWER SUPPLY WITH STARTUP CIRCUIT FOR LOW POWER DEVICES

BACKGROUND

Field

This disclosure relates generally to power supplies for low power devices, and more specifically, to a power supply with a startup circuit for low power devices.

Related Art

Using energy harvesting to power small Internet of Things (IoT) devices is becoming an attractive option to eliminate bulky batteries or power supplies. In addition, consumer demand for devices that are powered by sustainable and environmentally friendly power sources is ever-increasing. Microbial fuel cells, such plant microbial fuel cells (P-MFC), for example, are sustainable power sources that can generate small amounts of energy; however, the output voltage and currents can be so small that it is challenging to harvest energy from them. Integrated circuits (ICs) used in IoT devices are often required to startup from sources with minimal current driving capabilities and low supply voltages. Dedicated cold start circuits based on charge pump architectures can be used, but driving the IC's input/output circuitry during the startup phase can be challenging and places heavy requirements on the cold start circuit that can be difficult to meet.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of power supply devices including integrated circuitry (IC) to harvest energy from low-power non-conventional energy sources at high efficiency is disclosed. Due to the low voltage and current of the power source, a startup circuit is provided in which only a subset of the I/O circuitry pads and electrostatic discharge (ESD) circuitry is connected to the power source during startup. Once enough energy has been harvested to meet current and voltage requirements for normal operation, the startup circuit and startup portion of the I/O circuitry pad are disconnected, and the remaining portion of the I/O circuitry pads and electro-static discharge (ESD) circuitry are connected and a booster circuit takes over power management. Splitting the startup procedure in two phases improves reliability of startup by minimizing the load and external influences when limited energy is available.

A non-conventional energy source can be a plant microbial fuel cell (P-MFC) with organic matter that has one or more of the following attributes: self-sustaining, self-organized, reproduces, adapts to its environment, responds to stimuli, has a metabolism, or is in homeostasis. The organic matter can include but is not limited to: plants, fungi, protists, archaea, and bacteria, or entities that include either RNA or DNA molecules. For example, the organic matter 104 can be a single piece of fruit, or soil proximate to a living plant. Acid in a fruit provides transport for charge carriers between a center copper electrode and a set of galvanically connected surrounding zinc electrodes. The copper and zinc electrodes may degrade over time because they are part of the energy harvesting process. In another example, energy can be harvested from bacteria and sugar of a living water-based plant using two carbon electrodes. Since carbon electrodes in this example are not part of the energy process they will not degrade over time, thereby providing a constant power source as long as the plant is alive and has water.

Figure 1:
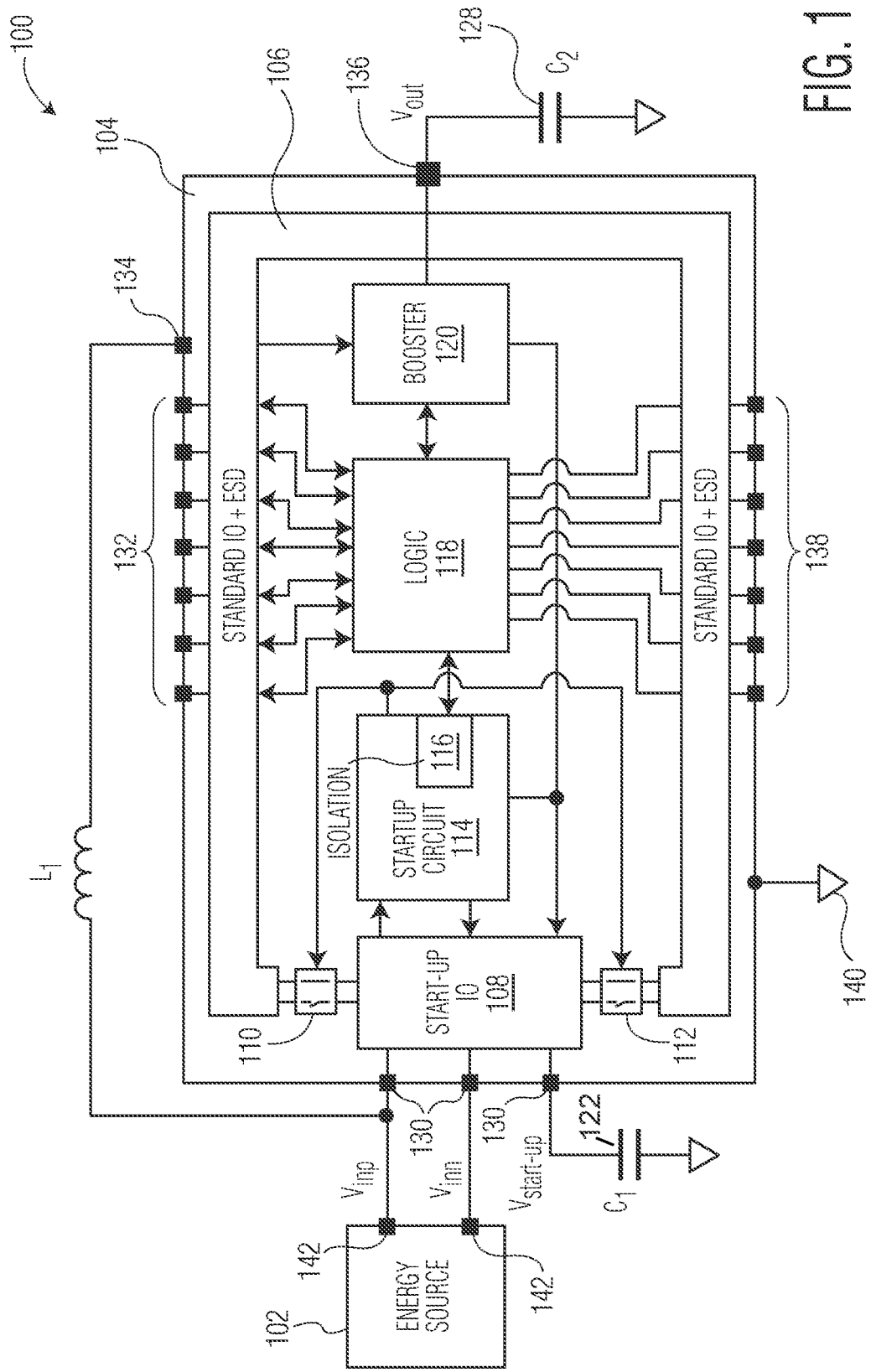
FIG. 1 illustrates a block diagram of components of a powered device with an energy source coupled to an integrated circuit in accordance with selected embodiments of the invention.

FIG. 1 illustrates a block diagram of components of powered device 100 with an energy source 102, startup capacitor 122, and output capacitor 128, coupled to integrated circuit (IC) 104 in accordance with selected embodiments of the invention. IC 104 includes startup I/O circuitry 108, standard I/O circuitry and ESD protection circuitry 106, connectors 110, 112 between startup I/O circuitry 108 and standard I/O circuitry and ESD protection circuitry 106, startup circuitry 114 including isolation circuit 116, logic circuit 118, and booster circuit 120. IC 104 includes a first set of I/O pins 130 coupled to startup I/O circuitry 108, and a second set of I/O pins 132, 134, 136, 138 coupled to standard I/O circuitry and ESD protection circuitry 106.

Energy source 102 includes I/O pins 142 coupled to respective I/O pins 130 to provide positive input voltage VINP and negative input voltage VINN to startup I/O circuit 114 through startup I/O circuitry 108. A third one of I/O pins 130 is coupled to startup capacitor 122, which charges to a higher voltage than energy source 102 during a startup mode of operation when switches in connections 110, 112 are open. Startup capacitor 122 discharges to provide startup voltage VSTARTUP to startup circuitry 114 when connections 110, 112 are closed. Booster circuit 120 can be started with the increased voltage on startup capacitor 122, which is sized to provide sufficient charge for a successful startup. Multiple energy sources 102 may be connected in parallel. Each source 102 can harvest at its own rate and level, while multiple sources 102 can charge a common startup capacitor 122.

Startup circuitry 114 generates signals to operate connectors 110, 112. For example, startup circuitry 114 opens connectors 110, 112 to allow startup capacitor 122 to charge during a first phase of a startup mode of operation. Using I/O circuitry 108 without I/O circuitry 106 decreases the amount of I/O circuitry, including ESD protection circuitry, that needs to be driven during startup. The reduced loading during startup relaxes the requirements on the startup circuit 114, allowing lower cold start voltages to be used. Once capacitor 122 is charged to a level that will provide sufficient power to startup remaining components in IC 104, startup circuitry 114 closes connectors 110,112 to connect startup I/O circuitry 108 to allow capacitor 122 and energy source 102 to provide power to logic circuitry 118 and booster circuitry 120 through I/O circuitry 106. Startup capacitor 122 can scale with the size of I/O circuitry 106. Once the startup phase ends, logic circuitry 118 can then be controlled externally, and booster circuit 120 can provide power to logic circuitry 118 instead of startup circuitry 114.

Logic circuitry 118 can include processing circuitry, memory device(s), peripheral interfaces, network interfaces, communication components such as receivers and transmitters for Bluetooth, Zigbee, near-field, and other communication protocols, and other digital and analog circuitry to provide desired functionality. Logic circuitry 118 includes conductive pads that are coupled to I/O pads 132 and 138 to communicate signals with devices external to powered device 100. In addition, logic circuitry 118 can be coupled to startup circuit 116 and booster circuit 120 by internal buses capable of conducting analog and digital signals unidirectionally or bi-directionally, as needed.

Booster circuit 120 is configured to transform a first voltage and current from energy source 102 into a second voltage and current that can be greater than a maximum value of the first voltage and current. Booster circuit 120 receives startup power from startup circuitry 114 during the startup mode of operation and normal operating power from energy source 102 during normal operation. Inductor L1 can be coupled between positive input voltage VINP and booster circuit 120 through I/O pin 134. A controller (not shown) can selectively open and close a charging switch and a discharge switch during different phases of operation including a first phase in which input voltage VINP charges the inductor L1, a second phase in which the input voltage VINP is disconnected and inductor L1 is allowed to discharge, and a third phase in which inductor L1 is not connected to energy source 102 or booster circuit 120.

In some embodiments, energy source 102 can include organic matter in the form of a plant microbial fuel cell (P-MFC) as well as other conventional or non-conventional energy sources. When energy source 102 has relatively low voltage and current, it may be difficult to generate sufficient power for f I/O circuitry 106, logic circuit 118, and booster circuit 120. For example, the very low voltages provide by certain organic matter 104 used for a power source in some example embodiments could be in a range of between 0.4 and 0.9 V and current up to 1 mA (e.g., a living plant power source may generate 0.66 V at 0.5 mA). As the water in the plant decreases, the voltage can drop to at or below 0.4 V. While booster circuit 120 and I/O circuitry 106 can work with a very low DC input voltage down to 0.4 V and boost the voltage to somewhere between 3.0 and 3.5 V, booster circuit 120 can require at least 0.62 to 0.7 V starting voltage for proper operation. Note that the preceding values are provided as examples, and the voltage and current required during startup and normal operation will vary based on the components in IC 100.

Figure 2:
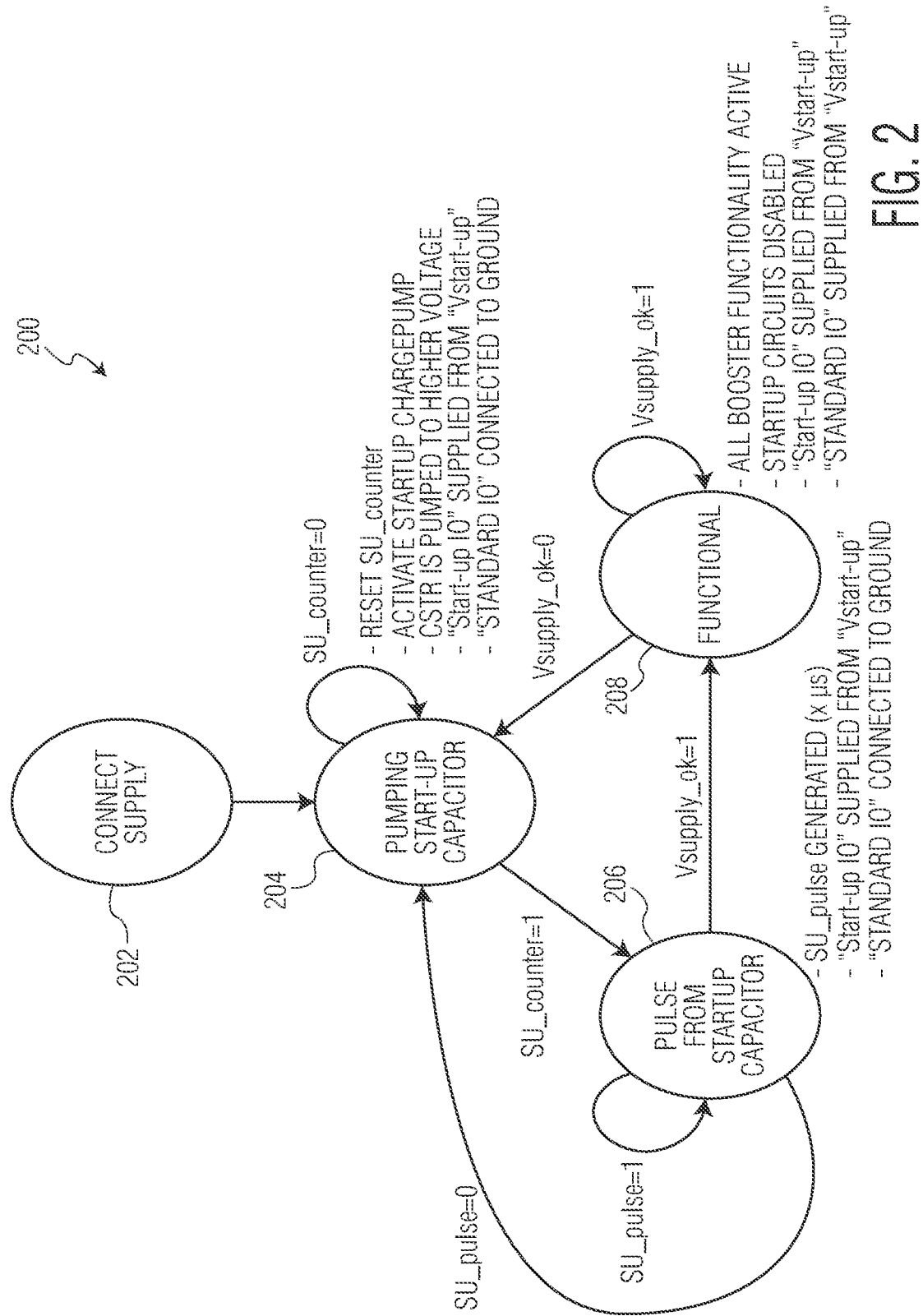
FIG. 2 illustrates a state machine for the startup circuitry of FIG. 1 in accordance with selected embodiments of the invention.

FIG. 2 illustrates a state machine 200 for startup circuitry 114 of FIG. 1 in accordance with selected embodiments of the invention. Startup circuitry 114 enters initialization state 202 when startup circuitry 114 is connected to energy source 102. State 204 is triggered by the end of initialization state 202. In state 204, a startup counter starts running and a charge pump in startup circuitry 116 can be activated to start pumping to startup voltage VSTARTUP. Standard and ESD I/O circuitry 106 is grounded. After counting for N cycles, state 206 is entered. Note that N can be translated to an amount of charge. Alternatively, a comparator could be used to transition to state 206 upon reaching a voltage threshold. When the charge pump voltage exceeds a predetermined level, for example, 400 mV or other suitable voltage, a startup counter indicator SU_COUNTER can be reset and starts counting from zero. The startup charge pump can start to charge startup capacitor 122 to a predetermined level, for example, approximately 1.2V or other suitable voltage.

Once the startup counter reaches a certain number of pulses, the startup counter indicator SU_COUNTER can be asserted. In state 206, a startup pulse is generated by the startup capacitor C1 within a certain time window. During this pulse, logic circuitry 118 and booster circuit 120 are activated, and standard and ESD I/O circuitry 106 is grounded. Booster circuit 120 takes over power management from startup circuit 116. When booster circuit 120 has successfully taken over, voltage supply indicator VSUPPLY_OK goes high. If the VSUPPLY_OK signal goes high before startup pulse indicator SU_PULSE has ended, functional state 208 will be entered, with logic circuit 118, booster circuit 120 and I/O ring 106 operating in normal mode. If startup pulse indicator SU_PULSE ends before booster circuit 120 has taken over, state machine 200 transitions back to state 204 to retry the startup procedure. When sufficient startup voltage is provided by startup capacitor 122, a voltage supply indicator VSUPPLY_OK can be asserted and the state machine 200 can transition to state 208. In state 208, startup circuit 114 can be disabled while booster circuit 120 provides power to logic circuitry 118 during other modes of operation besides startup mode. As long as the voltage supply indicator VSUPPLY_OK is asserted, state machine 200 can remain state 208 and booster circuitry 120 can regulate the voltage on startup capacitor 122. Start-up voltage VSTART-UP supplies start-up I/O circuitry 108 and standard and ESD I/O circuit 106. If booster circuit 120 is not able to provide sufficient power, the voltage supply indicator VSUPPLY_OK can be deasserted and state machine 200 can return to state 204 to deactivate booster circuit 120 and standard I/O circuitry 106, activate startup I/O circuitry 108 and startup circuitry 114, and begin re-charging startup capacitor 122.

After transitioning from state 204 to state 206, if the startup voltage provided by startup capacitor 122 is not sufficient, the startup pulse indicator SU_PULSE is deasserted, the voltage supply indicator VSUPPLY_OK remains unasserted, and state machine 200 returns to state 204.

Figure 3:
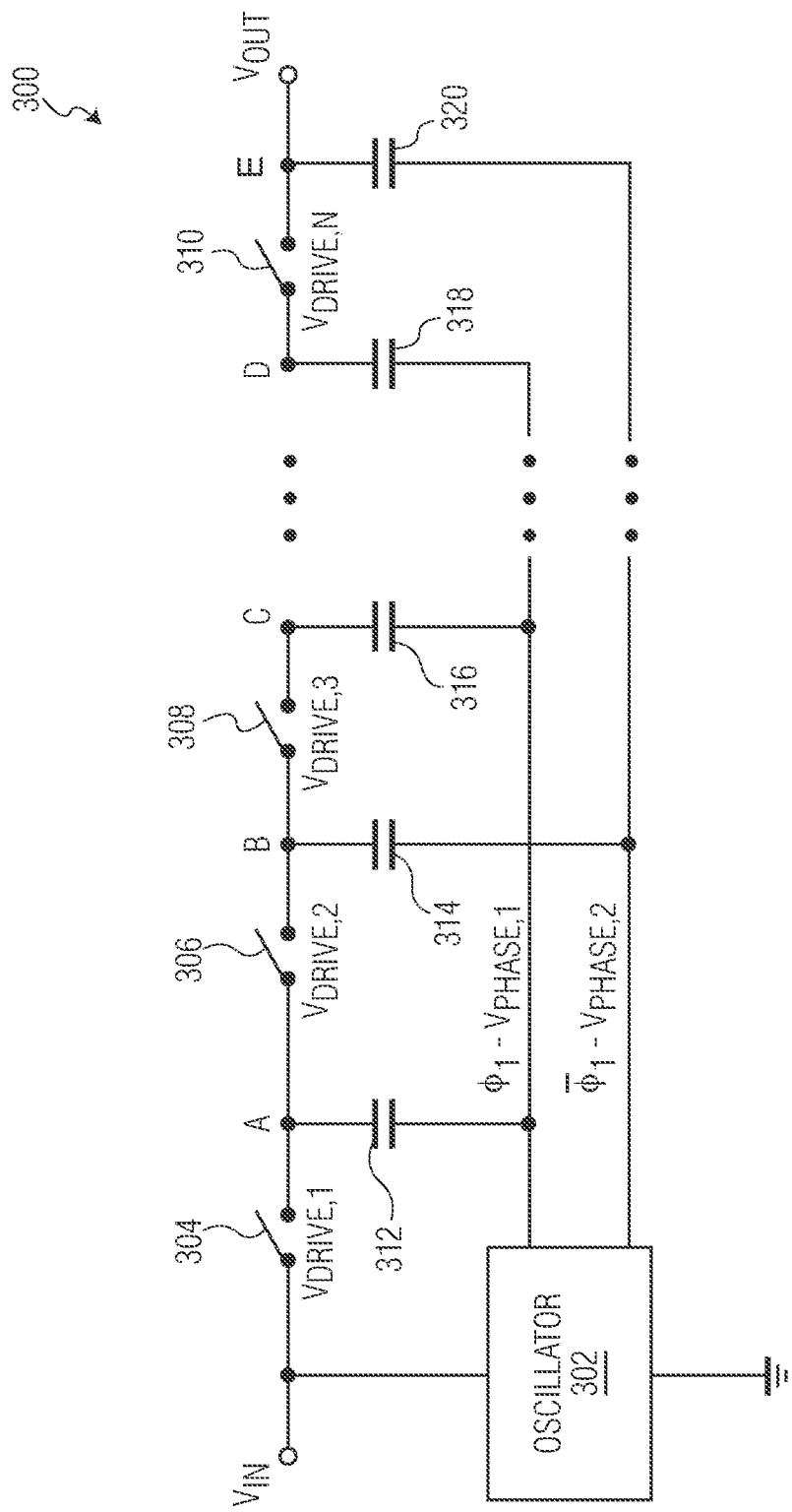
FIG. 3 is a schematic diagram of charge pump circuit that can be used in the startup circuit of FIG. 1 in accordance with selected embodiments of the invention.

FIG. 3 illustrates a schematic diagram of charge pump circuit 300 that can be used in startup circuit 114 of powered device 100 of FIG. 1 in accordance with selected embodiments of the invention. Charge pump circuit 300 is configured to increase a low-voltage supply, such as input voltage VIN, to the output voltage VOUT needed by another integrated circuit component, such as logic circuit 118. Charge pump circuit 300 can have a Dickson topology that includes oscillator 302, switches 304, 306, 308, 310, and capacitors 312, 314, 316, 318, 320.

Oscillator 302 includes a first terminal coupled to input voltage VIN and a second terminal coupled to ground. Oscillator 302 outputs two square waves VPHASE, VPHASE,2 that are the opposite of one another. That is, when VPHASE,1 is high, VPHASE,2 is low and vice versa. Switch 304 operates using first drive signal VDRIVE,1 and includes a first terminal coupled to input voltage VIN and a second terminal coupled to node A. Switch 306 operates using second drive signal VDRIVE,2 and includes a first terminal coupled to node A and a second terminal coupled to node B. Switch 308 operates using third drive signal VDRIVE,3 and includes a first terminal coupled to node B and a second terminal coupled to node C. Switch 310 operates using Nth drive signal VDRIVE,N and includes a first terminal coupled to node D and a second terminal coupled to node E. Signals VDRIVE1 . . . N to drive operation of switches 304, 306, 308, 310 can be provided from a microcontroller, clocking component, or any other suitable source. In operation, half of the switches are open at the same time. For example, switches 304, 308, 310 can be open while switch 306 is closed and vice versa.

Capacitor 312 includes a first terminal coupled to node A and a second terminal coupled to a first output of oscillator 302, VPHASE,1. Capacitor 314 includes a first terminal coupled to node B and a second terminal coupled to a second output of oscillator 302, VPHASE,2. Capacitor 316 includes a first terminal coupled to node C and a second terminal coupled to the first output of oscillator 302, VPHASE,1. Capacitor 318 includes a first terminal coupled to node D and a second terminal coupled to the first output of oscillator 302, VPHASE,1. Capacitor 320 includes a first terminal coupled to node E and a second terminal coupled to the second output of oscillator 302, VPHASE,2. The output voltage VOUT of charge pump circuit is provided at node E.

At the start of operation, capacitor 312 is not storing any charge and VPHASE,1 is low. When switch 304 closed and switch 306 is open, capacitor 312 charges through switch 304 up to input voltage Vin. VPHASE,1 goes high. The voltage across capacitor 312 will charge to input voltage VIN. Since VPHASE,1 is at VIN, and the voltage across capacitor 312 is input voltage VIN, the voltage at node A will be twice input voltage VIN (VPHASE,1 and VIN from capacitor 312).

The process repeats with the next stage. Switch 306 closes and switches 304, 308, 310 are open. Capacitor 314 charges to 2×VIN while VPHASE,2 is low and then increases to 3×Vin when VPHASE,2 goes high. During the subsequent stage, switch 308 closes and switches 304, 306, 310 are open. Capacitor 316 charges to 3×VIN while VPHASE,1 is low and then increases to 4×Vin when VPHASE,1 goes high. The operation for charging capacitors 318 and 320 to successively higher multiples of the input voltage VIN continues similar to that of the preceding stages, with each stage adding another increment of input voltage VIN to the level of charge.

Depending on the level of input voltage VIN provided and the level of output voltage VOUT required, additional switches and capacitors can be configured in charge pump 120 similar to switches 304-310 and capacitors 312-320. Alternatively, fewer switches and capacitors can be included in charge pump 120.

Figure 4:
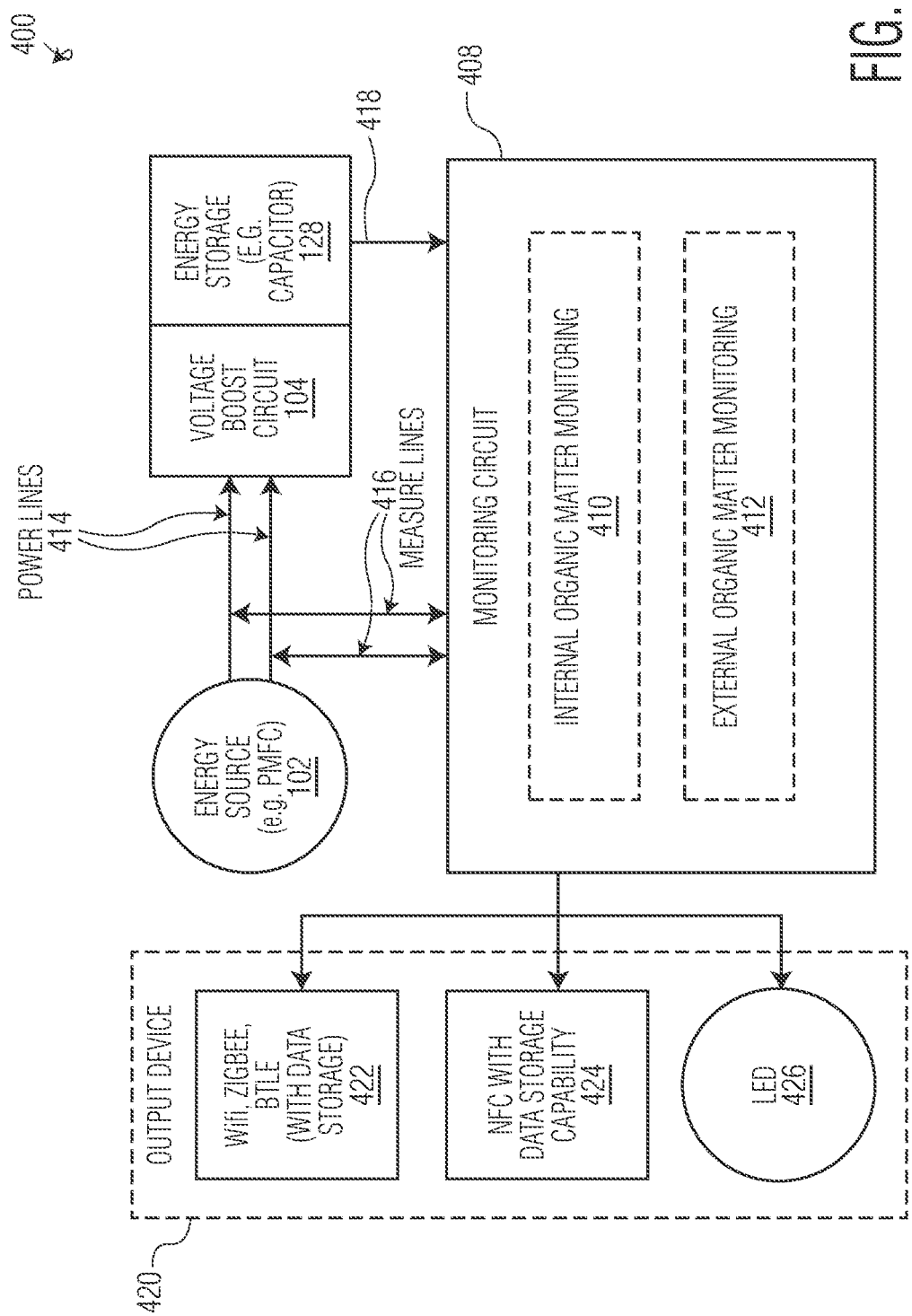
FIG. 4 illustrates a block diagram of components of a powered device with an energy source to provide power to output devices in accordance with selected embodiments of the invention.

FIG. 4 illustrates a block diagram of an organic matter powered device 400 in accordance with selected embodiments of the present invention. Device 400 can include a plant microbial fuel cell for energy source 102, voltage boost circuit 104, energy storage 128, monitoring circuit 408, input power lines 414, measure lines 416, output power line 418, and a set of output devices 420. A load (not shown) can be connected to the output voltage VOUT provided by booster circuit 120 on output line 418 to monitoring circuit 408. Energy storage device 128 can be connected in parallel with the load to smooth the output voltage VOUT that is provided to the load.

Monitoring circuit 408 can include internal organic matter monitoring circuit 410 and external organic matter monitoring circuit 412. Internal organic matter monitoring circuit 410 in some examples can be configured to periodically measure equivalent sugar production, bacterial damage, PH level, fructose level, photosynthesis, oxygen production, structural firmness, decay, insect damage, chemistry, and/or other suitable characteristics of energy source 102. The external organic matter monitoring circuit 412 in some examples is configured to periodically measure energy source's 102 surrounding environmental parameters such as temperature, equivalent sugar production, bacterial damage, PH level, fructose level, iron uptake, photosynthesis, oxygen production, structural firmness, decay, insect damage, chemistry and/or other attributes.

Input power lines 414 and measure lines 416 are coupled to receive the first voltage and current of energy source 102 of powered device 400. The output power line 418 is coupled to output the second voltage and current 414 to monitoring circuit 408.

Output devices 420 include communications devices such as far-field, Zigbee, BTLE (Bluetooth Low Energy), and even the more power consuming WiFi 422 (all with data storage), near-field communication (NFC) device 424 (with data storage), and radiation generating devices such as light emitting diode devices LED 426 (no storage device needed). Other devices such as an acoustic generation device (e.g., sound, perhaps to scare predators away), or direct temperature, humidity, daylight sensors can also be suitable output devices 420.

When an output device 420 is a communications transponder configured to generate a communications signal, then output device 420 can be coupled to receive the environmental attribute from the monitoring circuit 408 and modulate the environmental attribute on to the communications signal.

When an output device 420 is configured as a radiation source, the radiation source can either be configured as a long-distance communications tool (e.g., flashing or continuous visible LED) or in a feedback configuration.

An example feedback configuration includes when the set of electrodes are configured to be coupled to a first set of biologically active organic matter (plant microbial fuel cell) that is used in energy source 102, but the radiation source is configured to promote health or growth of a second set of biologically active organic matter. Additional sets of biologically active organic matter (not shown) in some example applications may be independent of the set of electrodes and/or the first set of biologically active organic matter. For example, the radiation source can be an ultra-violet (UV) radiation source or an infra-red (IR) radiation source that is powered by the first set of organic matter but promotes the health and/or growth of only the second set of organic matter.

In some examples, the first set of organic matter may not depend upon sunlight for growth and/or health, and the second set of organic matter does depend upon sunlight for growth and/or health. In one example application, oranges, that need UV light, can be grown underground using power from chicory and/or mushrooms, that do not need UV light.

Thus in otherwise harsh/unfavorable growing (e.g. little or no sunlight) conditions, the first set of organic matter can support growth of the second set of organic matter (e.g. one less-expensive or easier to grow type of sacrificial plant could be interspersed with a very expensive and/or hard to grow type of plant, flower, grape, etc.).

The first and second sets of organic matter can be in an enclosure (not shown) that substantially blocks radiated energy from an ambient environment. Such an enclosure could be a warehouse, a nursery, a hydroponic nursery, a Aeroponics nursery, an underwater nursery, a cave, or a space environment.

Figure 5:
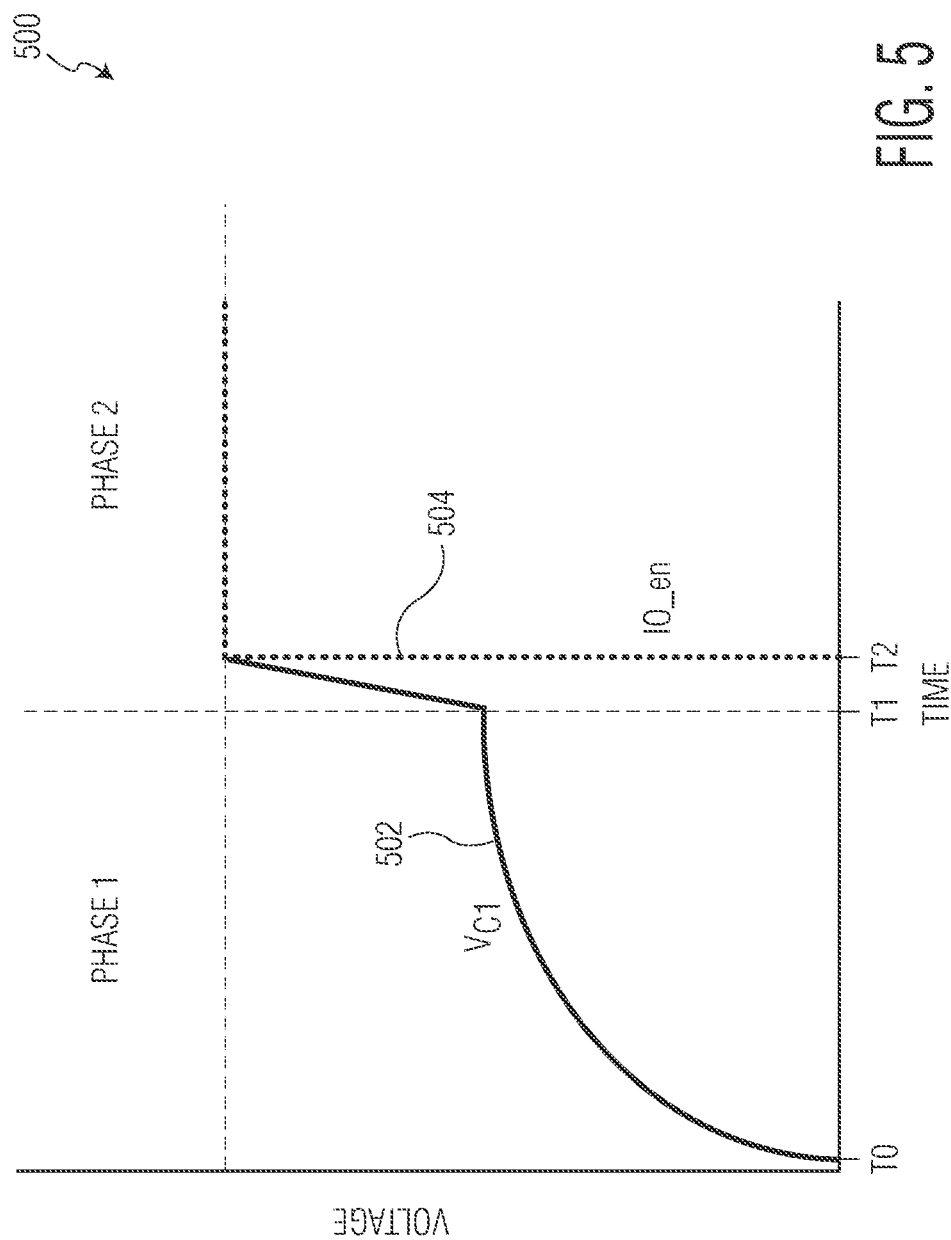
FIG. 5 illustrates voltage versus time graphs during startup and normal operation of the powered devices of FIGS. 1 and 4 in accordance with selected embodiments of the invention.

Referring to FIGS. 1, 4 and 5, FIG. 5 illustrates voltage versus time graphs during startup and normal operation of powered devices 100, 400 of FIGS. 1 and 4 in accordance with selected embodiments of the invention. Startup mode of operation occurs between time T0 and T1 when startup capacitor 122 is charging to a first level from voltage provided by energy source 102, as shown by curve 502. The startup phase corresponds to state 204 in FIG. 2. Once the charge on capacitor 122 reaches a predetermined level, startup I/O circuit 108 can be connected to standard I/O ring 106 to provide voltage for circuitry in standard I/O ring 106. Once the startup phase is complete, booster circuit 120 can be used to meet the voltage requirements for the operation of powered device 100, 400, as indicated by curve 504.

By now it should be appreciated that in selected embodiments there has been disclosed an integrated circuit (IC) (104) that can comprise an input/output (I/O) circuitry having a first circuitry section (106) including I/O pins (132, 134, 136, 158) and a second circuitry section (108) including I/O pins (130), wherein the first circuitry section and the second circuitry section are mutually exclusive sections of the I/O circuitry, the first circuitry section can comprise a first I/O pin configured to receive an input voltage from a first energy source, a second I/O pin connectable to an external startup capacitor, a startup circuit coupled to the first I/O pin and the second I/O pin and configured to, upon receiving the input voltage from the first energy source, isolate the first circuitry section from the second circuitry section during a startup phase of operation of the IC, provide charge to the external startup capacitor during the startup phase, and in response to achieving a predetermined minimum charge on the external startup capacitor, connecting the first circuitry section to the second circuitry section, and exiting the startup phase to enter a functional mode of operation of the IC.

In another aspect, the startup circuit can comprise a charge pump which provides charge to the external startup capacitor during the startup phase.

In another aspect, the charge pump can be powered by the input voltage from the energy source.

In another aspect, the startup circuit can be configured to, upon receiving the input voltage from the first energy source, wait until the input voltage reaches a predetermined voltage level to enable the charge pump to provide charge to the external startup capacitor.

In another aspect, the startup circuit further can comprise a counter, wherein the startup circuit can be configured to reset the counter to start counting when the input voltage reaches the predetermined voltage level.

In another aspect, the startup counter can be configured to connect the first section to the second section and enter the functional mode after the counter reaches a threshold count value.

In another aspect, the IC can further comprise internal circuitry coupled to I/O pins of the second circuitry section; and a booster circuit coupled to the second I/O pin and configured to during the functional mode of operation, power the internal circuitry and regulate a voltage at the second I/O pin provided by the external startup capacitor.

In another aspect, the IC can further comprise a set of switches between the first circuitry section and second circuitry section, wherein the startup circuit is configured to open the set of switches to isolate the first circuitry section from the second circuitry section, and close the set of switches to connect the first circuitry section to the second circuitry section.

In another aspect, the set of switches can comprise switches connected between power rails of the first circuitry section and corresponding power rails of the second circuitry section.

In another aspect, the first energy source can be characterized as a Plant Microbial Fuel Cell (P-MFC).

In another aspect, the first circuitry section further can comprise a third I/O pin configured to receive an input voltage from a second energy source in parallel with the first energy source.

In another aspect, each of the first and second energy sources can be characterized as a P-MFC.

In another embodiment, an integrated circuit (IC) can comprise a first plurality of input/output (I/O) pins coupled to a first power rail and a second plurality of I/O pins coupled to a second power rail. The first plurality of I/O pins can include a first I/O pin configured to receive an input voltage from an energy source; and a second I/O pin connectable to an external startup capacitor. A startup circuit can be coupled to the first I/O pin and the second I/O pin and have a charge pump. The startup circuit can be configured to, upon receiving the input voltage from the energy source, disconnect the first power rail from the second power rail to isolate the first plurality of I/O pins from the second plurality of I/O pins, enable a charge pump to provide charge to the external startup capacitor while the first power rail remains disconnected from the second power rail, and in response to achieving a minimum charge on the external startup capacitor, disable the charge pump and reconnect the first power rail to the second power rail.

In another aspect, the IC can further comprise a booster circuit coupled to the second I/O pin and configured to regulate a voltage on the external startup capacitor after the charge pump is disabled and the first power rail is reconnected to the second power rail.

In another aspect, the startup circuit can be configured to enable the charge pump when the input voltage reaches a predetermined voltage level.

In another aspect, the startup circuit further can comprise a counter and be configured to reset the counter to start counting when the input voltage reaches the predetermined voltage level, and disable the charge pump after the counter reaches a threshold count value.

In another aspect, the IC can further comprise a set of switches between the first power rail and the second power rail, wherein the startup circuit is configured to open the set of switches to isolate the first plurality of I/O pins from the second plurality of I/O pins, and close the set of switches to connect the first power rail to the second power rail.

In another aspect, the energy source can be characterized as a Plant Microbial Fuel Cell (P-MFC).

In further embodiments, an integrated IC having a first circuitry section including I/O pins and a second circuitry section including I/O pins, the first circuitry section and the second circuitry section are mutually exclusive sections of an I/O ring, a method can comprise in response to receiving an input voltage from a Plant Microbial Fuel Cell (P-MFC) at a first I/O pin in the first circuitry section, providing charge to an external startup capacitor connected to a second I/O pin in the first circuitry section while maintaining the first circuitry section isolated from the second circuitry section. In response to achieving a predetermined charge on the external startup capacitor, connecting the second circuitry section to the first circuitry section. With the second circuitry section connected to the first circuitry section, operating in functional mode using a booster circuit coupled to the first I/O pin to power internal circuitry of the IC, wherein the internal circuitry is coupled to I/O pins in the second circuitry section.

In another aspect, providing the charge to the external startup capacitor can comprise enabling a charge pump to provide the charge to the external startup capacitor, and wherein, in response to achieving the predetermined charge on the external startup capacitor, the method further can comprise disabling the charge pump.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments selected instructions/steps can be implemented as functional and software instructions. In other embodiments, selected functions and instructions can be implemented either using logic gates, data storage (memory), application specific chips, firmware, as well as other hardware forms.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit (IC) comprising:
 an input/output (I/O) circuitry having a first circuitry section including I/O pins and a second circuitry section including I/O pins, wherein the first circuitry section and the second circuitry section are mutually exclusive sections of the I/O circuitry, the first circuitry section comprising:

a first I/O pin configured to receive an input voltage from a first energy source; and a second I/O pin connectable to an external startup capacitor;

a startup circuit coupled to the first I/O pin and the second I/O pin and configured to, upon receiving the input voltage from the first energy source:

isolate the first circuitry section from the second circuitry section during a startup phase of operation of the IC, provide charge to the external startup capacitor during the startup phase, and in response to achieving a predetermined minimum charge on the external startup capacitor, connecting the first circuitry section to the second circuitry section, and exiting the startup phase to enter a functional mode of operation of the IC, wherein the startup circuit comprises a charge pump configured to provide charge to the external startup capacitor during the startup phase.

2. The IC of claim 1, wherein the charge pump is powered by the input voltage from the energy source.

3. The IC of claim 1, wherein the startup circuit is configured to, upon receiving the input voltage from the first energy source, wait until the input voltage reaches a predetermined voltage level to enable the charge pump to provide charge to the external startup capacitor.

4. The IC of claim 3, wherein the startup circuit further comprises a counter, wherein the startup circuit is configured to reset the counter to start counting when the input voltage reaches the predetermined voltage level.

5. The IC of claim 4, wherein the startup counter is configured to connect the first circuitry section to the second circuitry section and enter the functional mode after the counter reaches a threshold count value.

6. The IC of claim 4, further comprising:

a set of switches between the first circuitry section and second circuitry section, wherein the startup circuit is configured to open the set of switches to isolate the first circuitry section from the second circuitry section, and close the set of switches to connect the first circuitry section to the second circuitry section.

7. The IC of claim 6, wherein the set of switches comprises:

switches connected between power rails of the first circuitry section and corresponding power rails of the second circuitry section.

8. The IC of claim 1, further comprising:

internal circuitry coupled to I/O pins of the second circuitry section; and a booster circuit coupled to the second I/O pin and configured to:

during the functional mode of operation, power the internal circuitry and regulate a voltage at the second I/O pin provided by the external startup capacitor.

9. An integrated circuit comprising:

an input/output (I/O) circuitry having a first circuitry section including I/O pins and a second circuitry section including I/O pins, wherein the first circuitry section and the second circuitry section are mutually exclusive sections of the I/O circuitry, the first circuitry section comprising:

a first I/O pin configured to receive an input voltage from a first energy source, wherein the first energy source is characterized as a Plant Microbial Fuel Cell (P-MFC); and a second I/O pin connectable to an external startup capacitor;

a startup circuit coupled to the first I/O pin and the second I/O pin and configured to, upon receiving the input voltage from the first energy source:

isolate the first circuitry section from the second circuitry section during a startup phase of operation of the IC, provide charge to the external startup capacitor during the startup phase, and in response to achieving a predetermined minimum charge on the external startup capacitor, connecting the first circuitry section to the second circuitry section, and exiting the startup phase to enter a functional mode of operation of the IC.

10. An integrated circuit comprising:

an input/output (I/O) circuitry having a first circuitry section including I/O pins and a second circuitry section including I/O pins, wherein the first circuitry section and the second circuitry section are mutually exclusive sections of the I/O circuitry, the first circuitry section comprising:

a first I/O pin configured to receive an input voltage from a first energy source;

a third I/O pin configured to receive an input voltage from a second energy source in parallel with the first energy source; and a second I/O pin connectable to an external startup capacitor;

a startup circuit coupled to the first I/O pin and the second I/O pin and configured to, upon receiving the input voltage from the first energy source:

isolate the first circuitry section from the second circuitry section during a startup phase of operation of the IC, provide charge to the external startup capacitor during the startup phase, and in response to achieving a predetermined minimum charge on the external startup capacitor, connecting the first circuitry section to the second circuitry section, and exiting the startup phase to enter a functional mode of operation of the IC.

11. The IC of claim 10, wherein each of the first and second energy sources is characterized as a P-MFC.

12. An integrated circuit (IC) comprising:

a first plurality of input/output (I/O) pins coupled to a first power rail and a second plurality of I/O pins coupled to a second power rail, wherein the first plurality of I/O pins includes:

a first I/O pin configured to receive an input voltage from an energy source; and a second I/O pin connectable to an external startup capacitor;

a startup circuit coupled to the first I/O pin and the second I/O pin and having a charge pump, the startup circuit configured to:

upon receiving the input voltage from the energy source, disconnect the first power rail from the second power rail to isolate the first plurality of I/O pins from the second plurality of I/O pins, enable a charge pump to provide charge to the external startup capacitor while the first power rail remains disconnected from the second power rail, and in response to achieving a minimum charge on the external startup capacitor, disable the charge pump and reconnect the first power rail to the second power rail.

13. The IC of claim 12, further comprising:
a booster circuit coupled to the second I/O pin and configured to regulate a voltage on the external startup capacitor after the charge pump is disabled and the first power rail is reconnected to the second power rail.

14. The IC of claim 12, wherein the startup circuit is configured to enable the charge pump when the input voltage reaches a predetermined voltage level.

15. The IC of claim 14, wherein the startup circuit further comprises a counter, wherein the startup circuit is configured to reset the counter to start counting when the input voltage reaches the predetermined voltage level, and disable the charge pump after the counter reaches a threshold count value.

16. The IC of claim 12, further comprising:
a set of switches between the first power rail and the second power rail, wherein the startup circuit is configured to open the set of switches to isolate the first plurality of I/O pins from the second plurality of I/O pins, and close the set of switches to connect the first power rail to the second power rail.

17. The IC of claim 12, wherein the energy source is characterized as a Plant Microbial Fuel Cell (P-MFC).

18. In an integrated IC having a first circuitry section including I/O pins and a second circuitry section including I/O pins, wherein the first circuitry section and the second circuitry section are mutually exclusive sections of an I/O ring, a method comprising:
in response to receiving an input voltage from a Plant Microbial Fuel Cell (P-MFC) at a first I/O pin in the first circuitry section, providing charge to an external startup capacitor connected to a second I/O pin in the first circuitry section while maintaining the first circuitry section isolated from the second circuitry section;
in response to achieving a predetermined charge on the external startup capacitor, connecting the second circuitry section to the first circuitry section; and
with the second circuitry section connected to the first circuitry section, operating in functional mode using a booster circuit coupled to the first I/O pin to power internal circuitry of the IC, wherein the internal circuitry is coupled to I/O pins in the second circuitry section.

19. The method of claim 18, wherein the providing the charge to the external startup capacitor comprises enabling a charge pump to provide the charge to the external startup capacitor, and wherein, in response to achieving the predetermined charge on the external startup capacitor, the method further comprises disabling the charge pump.

* * * * *